United States Patent [19]
Wakana et al.

[11] Patent Number: 5,550,479
[45] Date of Patent: Aug. 27, 1996

[54] SIGNAL MEASURING APPARATUS AND SIGNAL MEASURING METHOD

[75] Inventors: Shinichi Wakana; Kazuyuki Ozaki; Yoshiro Goto, all of Kawasaki; Yasutoshi Umehara, Tokyo, all of Japan

[73] Assignees: Fujitsu Limited, Kanagawa; Advantest Corporation, Tokyo, both of Japan

[21] Appl. No.: 498,911

[22] Filed: Jul. 6, 1995

[30] Foreign Application Priority Data

Jul. 8, 1994 [JP] Japan .................. 6-157285

[51] Int. Cl.$^6$ .................. G01R 31/302
[52] U.S. Cl. .................. 324/750; 324/751; 324/752; 324/753
[58] Field of Search .................. 324/750, 751, 324/752, 753, 96; 250/310

[56] References Cited

U.S. PATENT DOCUMENTS

| | | | |
|---|---|---|---|
| 4,870,344 | 9/1989 | Stille | 250/310 |
| 5,185,571 | 2/1993 | Brust | 324/751 |
| 5,185,572 | 2/1993 | Yagi et al. | 324/750 |
| 5,465,043 | 11/1995 | Sakai | 324/96 |

OTHER PUBLICATIONS

Literature (30a–P–4) of Society for Applied Physics in Autumn of 1993, p. 506 month unavailable.

*Primary Examiner*—Kenneth A. Wieder
*Assistant Examiner*—Kourosh Cyrus Khosravi
*Attorney, Agent, or Firm*—Nikaido, Marmelstein, Murray & Oram LLP

[57] ABSTRACT

In a signal measuring apparatus a distance between a sample and a probe is adjusted, a voltage is applied through the sample and the probe and a signal is measured using a current flowing through the sample and the probe. That is, a current flowing through the sample and the probe is chopped by a laser beam at a prescribed frequency and is fetched into a sampling apparatus to generate a sample value of the current. The sample value is compared with a current setting value arbitrarily set in a comparator, and a reference voltage is generated according to a compared result in a control logic circuit and a D/A converter. The reference voltage is fed back to the sampling apparatus to converge the current flowing through the sample and the probe at the current setting value. Therefore, a signal of the sample is measured according to the reference voltage on condition that the current is converged at the current setting value.

15 Claims, 11 Drawing Sheets

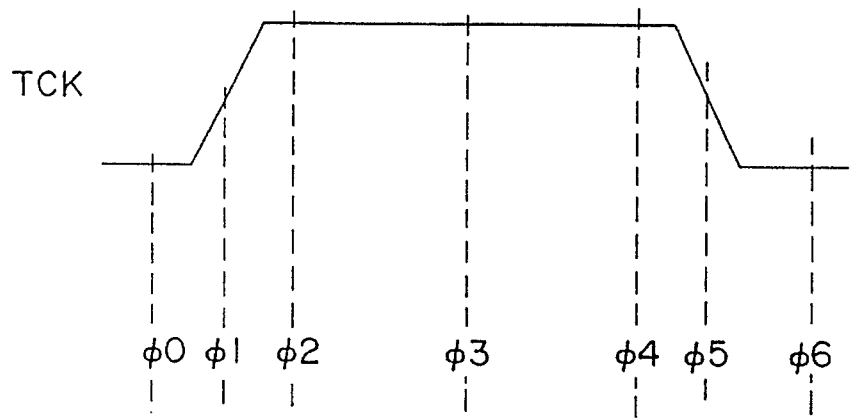
FIG.11A
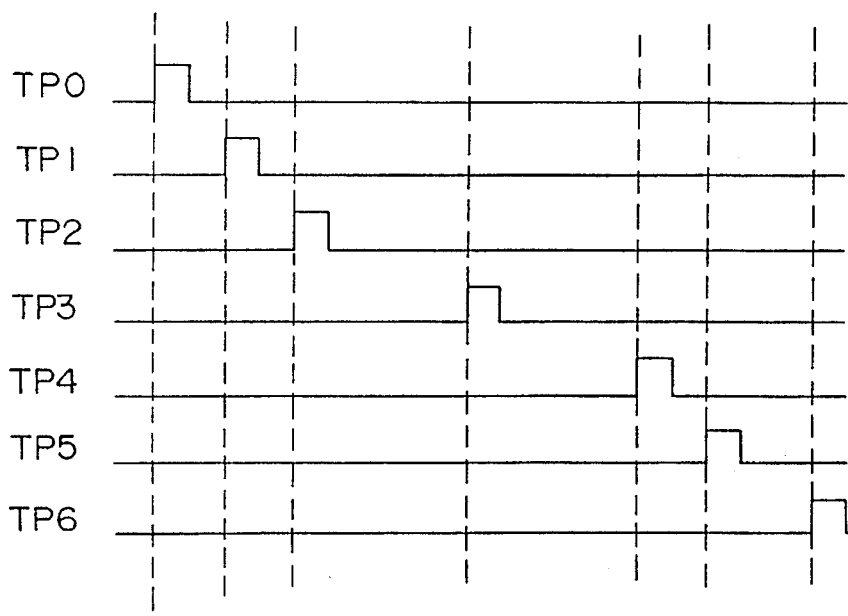
FIG.11B
FIG.11C
FIG.11D
FIG.11E
FIG.11F
FIG.11G
FIG.11H
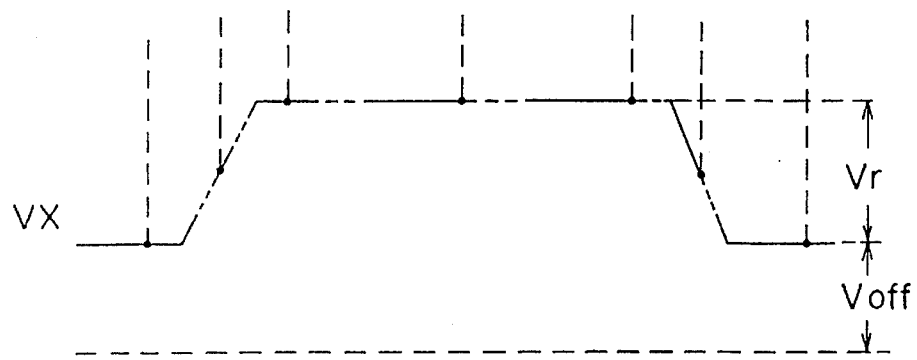
FIG.11I

SIGNAL MEASURING APPARATUS AND SIGNAL MEASURING METHOD

BACKGROUND OF THE INVENTION

1. Field of the Invention

The present invention relates to a signal measuring apparatus and a signal measuring method in which a high speed actuating signal generated in a semiconductor large scale integrated circuit (hereinafter, called LSI) or a semiconductor very large scale integrated circuit (hereinafter, called VLSI) is measured.

2. Description of the Prior Art

Recently, an LSI or VLSI having a very fine circuit pattern has been manufactured with the development of a fine processing technique resulting from the advance of a mask and exposing technique. Therefore, an inspection technique for inspecting the very fine circuit pattern has been advanced to a high level from year to year, and the enhancement of performances such as a spatial resolution and a time resolution in an LSI inspection apparatus or a failure analysis apparatus has been requested more and more strictly.

In an inspection apparatus in which a conventionally used laser probe or an electron-beam probe is utilized, restrictions resulting from a measuring principle such as a scale-down limitation of a probe diameter resulting from a restriction of a light wavelength and a disturbance of an accurate voltage measurement resulting from a charge-up of samples exist as problems. In the future, in cases where a very fine circuit pattern manufactured with the development of a fine processing technique is inspected with a conventional inspection apparatus, the inspection of the fine circuit pattern becomes more and more difficult.

Therefore, a signal measuring apparatus and a probing method in which a high speed actuating signal generated in a semiconductor device can be measured with a scanning tunnel microscope (STM) or an atomic-force microscope (AFM) in which an atomic image can be observed is required.

Hereinafter, a signal measuring method in which an actuating signal generated in an LSI or VLSI having a very fine circuit pattern is measured is described.

FIG. 1 is a constitutional view of a non-contact probe type of LSI inspection apparatus (hereinafter, called a first apparatus) in which a scanning tunnel microscope (STM) disclosed in a literature (30a-P-4) of Society for Applied Physics in autumn of 1993. In FIG. 1, a piezo actuator 1A has a probe 101, a piezo device 102 and a feed back actuating element 103. In the piezo actuator 1A, a distance between the probe 101 and a device 26 is adjusted to get a constant value of tunnel current $I_t$ between the probe 101 and the device surface 26.

2A denotes a photoconductive element for chopping the tunnel current $I_t$. When a laser beam is radiated to the photoconductive element 2A, the photoconductive element 2A is excited and is instantaneously set in a conductive condition. The photoconductive element 2A is placed between the probe 101 and the piezo element 102. 3A denotes a waveform measuring circuit for converting the tunnel current $I_t$ into a voltage and measuring a waveform of the voltage, and the waveform measuring circuit 3A has a current/voltage converter (hereinafter, simply called I/V converter) 301 and an amplifier and low pass filter 302.

4A denotes a pulse oscillator (or a pulse generator) for converting a sine wave signal having a frequency f+Δf into a trigger signal and generating a series of pulses having the frequency f+Δf to sample the tunnel current $I_t$. In this case, the frequency f denotes an actuating frequency of the device 26 and is equal to almost 100 MHz. An intensity of the tunnel current $I_t$ is changed by an actuating signal of the device 26. The symbol Δf denotes a differential frequency and is equal to about several KHz. 5A denotes a laser diode for generating a laser beam according to the series of pulses having the frequency f+Δf.

6A denotes a function generator for outputting the sine wave signal having the frequency f+Δf to the pulse generator 4A, 7A denotes a mixing circuit for mixing the sine wave signal having the frequency f+Δf transferred from the function generator 6A and a sine wave signal having a frequency f and forming a beat signal having the frequency Δf, 8A denotes a function generator for outputting the sine wave signal having the frequency f to the device 26 and the mixing circuit 7A, and 9A denotes an oscilloscope for sampling an output voltage of the amplifier and low pass filter 302 in synchronism with the beat signal having the frequency Δf and displaying a waveform of the output voltage sampled.

Next, an operation of the first apparatus is described. For example, in cases where a waveform of voltage of a strip line (hereinafter, simply called a device) 16 in a 50 L system is observed as a sample, a position of the probe 101 is adjusted by the piezo actuator 102 to approach to a wiring of the device 26 as close as possible for the purpose of passing the tunnel current $I_t$ between the probe 101 and the device 26. The tunnel current $I_t$ passes through a route of the I/V converter 301→a ground GND→the device 26→the probe 101→the photoconductive element 2A→the I/V converter 301. In this case, the distance between the probe 101 and the device 26 is controlled to a constant value by the piezo actuator 102 which is operated under the control of the feed back actuating element 103 according to the tunnel current $I_t$.

Thereafter, to operate the device 26, a sine wave signal (or a clock signal) having a frequency f is supplied from the function generator 8A to the device 26 through a Schottky diode. While supplying the sine wave signal having the frequency f, a trigger signal having a frequency f+Δf, which differs from the frequency f by a differential frequency Δf, is generated in the function generator 6A, and the trigger signal is output to the pulse oscillator 4A and the mixing circuit 7A. In the pulse oscillator 4A, a series of pulses having the frequency f+Δf is generated according to the trigger signal, and a laser beam L is generated according to the series of pulses having the frequency f+Δf in the laser diode 5A. Thereafter, when the laser beam L is radiated to the photoconductive element 2A, the photoconductive element 2A is instantaneously excited to a conductive state because the photoconductive element 2A is excited by the laser beam L. As a result, the tunnel current $I_t$ flowing between the prove 101 and the device 26 is chopped. The tunnel current $I_t$ varies with an actuating voltage of the device 26. The tunnel current $I_t$ is converted into a voltage in the I/V converter 301, subsequently the voltage is amplified and filtered in the amplifier and low pass filter 302 to form an output voltage, and the output voltage shaped is input to the oscilloscope 9A.

Also, while supplying the sine wave signal having the frequency f, a sine wave signal having the frequency f transferred from the function generator 8A and the trigger signal having the frequency f+Δf transferred from the function generator 6A are mixed in the mixing circuit 7A to form a beat signal having a frequency Δf, and the beat signal is output to the oscilloscope 9A. As a result, in the oscilloscope 9A, the output voltage transferred from the amplifier and low pass filter 302 is sampled in synchronization with the beat signal. Therefore, a high speed waveform of voltage transferred from the device 26 is observed, and a relative electric potential of the device 26 is found out.

FIG. 2 is a constitutional view of a contact probe type of LSI inspection apparatus (hereinafter, called a second apparatus) in which an atomic force microscope is applied. In FIG. 2, the second apparatus is provided with a piezo actuator 1B, a photoconductive element 2B, a waveform measuring circuit 3B, a pulse oscillator (or a pulse generator) 4A, a laser diode 5B, two function generators 6B, 8B, a mixing circuit 7B and an oscilloscope 9B. The piezo actuator 1B is composed of a contact probe 104, piezo element 105, a feed back actuating element 106 and a photo-detector 107, and a photoconductive element 2B is arranged between the contact probe 104 and the piezo element 105. The contact probe 104 is attached to an AFM cantilever. The waveform measuring circuit 3B has a current/voltage converter (hereinafter, simply called I/V converter) 303 and an amplifier and low pass filter 304. The elements of which names are the same as those in the first apparatus have the same functions as those in the first apparatus. Therefore, the description of the functions of the elements which are the same as those in the first apparatus are omitted.

Next, an operation of the second apparatus is described. For example, in cases where a waveform of voltage in the device 16 which is not covered with any insulating film, the contact probe 104 is set in ohmic-contact with the device 16 by the piezo element 105. This ohmic-contact condition is controlled to a constant contact using a principle of a laser leverage. For example, the feed-back actuating element 106 functions according to a displacement detecting signal detected by the photo-detector 107, and the contact probe 104 is in constant contact with the device 16 by the piezo element 105 under the control of the feed back actuating element 106. Thereafter, a sine wave having a frequency f is supplied from the function generator 8B to the device 16 through a diode, in the same manner as the first apparatus.

While supplying the sine wave having the frequency f, a trigger signal having a frequency $f+\Delta f$ which differs from the frequency f of the sine wave by a differential frequency $\Delta f$ is generated in the function generator 6B, and the trigger signal is output to the pulse oscillator 4A and the mixing circuit 7B. In the pulse oscillator 4A, a series of pulses having a frequency $f+\Delta f$ is generated according to the trigger signal, and a laser beam L is generated in the laser diode 5B according to the series of pulses having the frequency $f+\Delta f$. When the laser beam L is radiated to the photoconductive element 2B, the photoconductive element 2B is instantaneously set in a conductive condition because the photoconductive element 2B is excited by the laser beam. Therefore, an ohmic current I flowing between the probe 104 and the device 16 is chopped. The ohmic current I varies with an actuating voltage of the device 16. The ohmic current I is converted into a voltage in the I/V converter 303, the voltage is shaped in the amplifier and low pass filter 304 to form an output voltage, and the output voltage is output to the oscilloscope 9B.

Also, while supplying the sine wave signal having the frequency f, the sine wave signal having the frequency f transferred from the function generator 8B and the trigger signal having the frequency $f+\Delta f$ transferred from the function generator 6B are mixed in the mixing circuit 7B to form a beat signal having a frequency $\Delta f$, and the beat signal is output to the oscilloscope 9B. As a result, in the oscilloscope 9B, the output voltage transferred from the amplifier and low pass filter 302 is sampled in synchronization with the beat signal. Therefore, a high speed waveform of voltage transferred from the device 16 is observed, and a relative electric potential of the device 16 is determined.

In the first apparatus described as an example of the prior art, an input impedance of the probe 101 is set to a high value, so that the tunnel current $I_t$ is set to several tens of nano amperes. Therefore, a circuit load in the device 26 can be reduced. Also, because a voltage of the device 26 can be measured in a perfect non-contact and non-destructive condition, a spatial resolution can be enhanced. Here, the spatial resolution denotes an ability for separating two signals having frequencies close to each other.

However, in the first apparatus, the waveform measuring circuit 3A functions to process the tunnel current $I_t$ having a very low value. Therefore, in cases where an actuating signal in the device 26 has an amplitude higher than a prescribed value, an energy level of the actuating signal exceeds a tunnel region, and there is a problem that it becomes difficult to measure the voltage of the device 26 in a superior linearity. An upper limit of the voltage is about 1 Vp-p at the most. Also, there is another problem that it is difficult to obtain a surface image of the device 26 and the waveform of the voltage at the same time.

In the second apparatus, the contact probe 104 can be stably in contact with the device 16 using the cantilever in which a laser leverage method is utilized, and a surface image of the device 16 can be obtained in addition to the stable contact. In addition, because the contact probe 104 is in directly ohmic-contact with the device 16, even though the actuating voltage of the device 16 is high, the voltage can be measured in a superior linearity.

However, in the second apparatus, because an ohmic contact resistance is comparatively low when the photoconductive element 2B is set in an "on" condition, the ohmic contact resistance undesirably functions as a circuit load in the device 16. Also, in cases where an insulating layer such as an air-oxide film or the like remains on the device 16, it is required to set the contact probe 104 in ohmic contact with a wiring of the device 16 while the contact probe 104 breaks through the insulating layer. In this case, it is required push the contact probe 104 onto the device 16. Therefore, there is a probability that a high sharp needle mint of the contact probe 104 is damaged and broken.

Also, in the second apparatus, because the cantilever having a low spring constant is used, it is difficult to push down the cantilever with a sufficiently strong force. In addition, the ohmic current flowing through the contact probe 104 is determined by the ohmic contact resistance and an input impedance of the I/V converter 303. Therefore, in cases where a metallic surface of a top portion of the contact probe 104, a wiring portion of the device (or sample) 16 or the like is covered with an oxide film, the ohmic contact resistance varies. In this case, there is a problem that it is difficult to probe the device 16 with a high reliability.

SUMMARY OF THE INVENTION

An object of the present invention is to provide, with due consideration to the drawbacks of such a conventional signal measuring apparatus and method, a signal measuring apparatus and a signal measuring method in which an absolute voltage and a waveform of a high speed actuating signal existing in a very large scale integrated circuit or the like are measured with a high accuracy.

The object of the present invention is achieved by the provision of a signal measuring apparatus for adjusting a distance between a sample and a probe and measuring an actuating signal using a current flowing through the sample and the probe when a voltage is applied therebetween, comprising means for sampling a current flowing through the sample and the probe according to a reference voltage to obtain a sample value, means for comparing the sample value obtained in the sampling means and a current setting value arbitrarily set and control means for receiving an output signal of the comparing means, generating the reference voltage according to the output signal, feeding back the reference voltage to the sampling means and controlling the current flowing through the sample and the probe using the reference voltage to converge the current at the current setting value, thereby measuring the actuating signal of the sample according to the reference voltage on condition that the current is converged at the current setting value.

In the above configuration, because the current to be sampled can be converged at the current setting value according to the reference voltage, a tunnel current having a very low intensity can be processed with a high accuracy, and an absolute voltage of the sample can be measured according to the reference voltage on condition that the current flowing through the sample and the probe is converged at the current setting value.

In another apparatus according to the present invention, adjusting means for adjusting the distance between the sample and the probe or scanning means for scanning one of samples, and displaying means for displaying a piece of image information of the sample according to a displacement value of the probe are arranged. In the above configuration, a surface image of the sample and a waveform of the voltage of the sample can be obtained at the same time, and the sample can be easily probed.

Also, in another apparatus according to the present invention, the probe is operated according to a method in which a cantilever having a low spring constant is used, or the probe is operated according to a method in which a vertical needle supported by a plate spring is used. In the above configuration, even though an oxide film remains on the sample, the sample can be probed with the probe with accuracy without forcibly applying a force on the sample. Therefore, a metallic surface of a top portion of the probe, a wiring of the sample or the like can be protected.

In a signal measuring method according to the present invention, a reference voltage is generated by comparing a sample value of a current flowing between a sample and a probe. Therefore, the current flowing through the sample and the probe can be converged at a current setting value set in advance according to the reference voltage.

Therefore, a current flowing in a top portion of the probe can be arbitrarily set according to the current setting value, and an actuating signal of the sample can be obtained from the reference voltage when the current is converged at the current setting value. As a result, even though a waveform of a signal in the sample has an amplitude higher than a prescribed amplitude, the current flowing through the sample and the probe can be converged at the current setting value. Therefore, the voltage of the sample can be measured in a superior linearity, and a waveform of a high speed signal can be reproduced.

Also, in another apparatus according to the present invention, even though an insulating layer such as an air-oxide film or the like remains on the sample, the probe is positioned on the sample without breaking through the insulating film, a tunnel current flows, and the tunnel current is sampled according to a reference voltage. Therefore, a top portion of the probe can be maintained to a highly sharp condition.

Accordingly, a voltage and a waveform of a high speed actuating signal existing in an LSI or VLSI or the like can be measured, and the present invention greatly contributes to the provision of a tunnel current type of signal measuring apparatus or an inter-atomic force type of signal measuring apparatus in which a probing operation can be performed in an atomic level.

BRIEF DESCRIPTION OF THE DRAWINGS

FIG. 11 is a waveform view of a signal supplementing the measuring flow chart shown in FIG. 10;

DETAILED DESCRIPTION OF THE EMBODIMENTS

Figure 1:
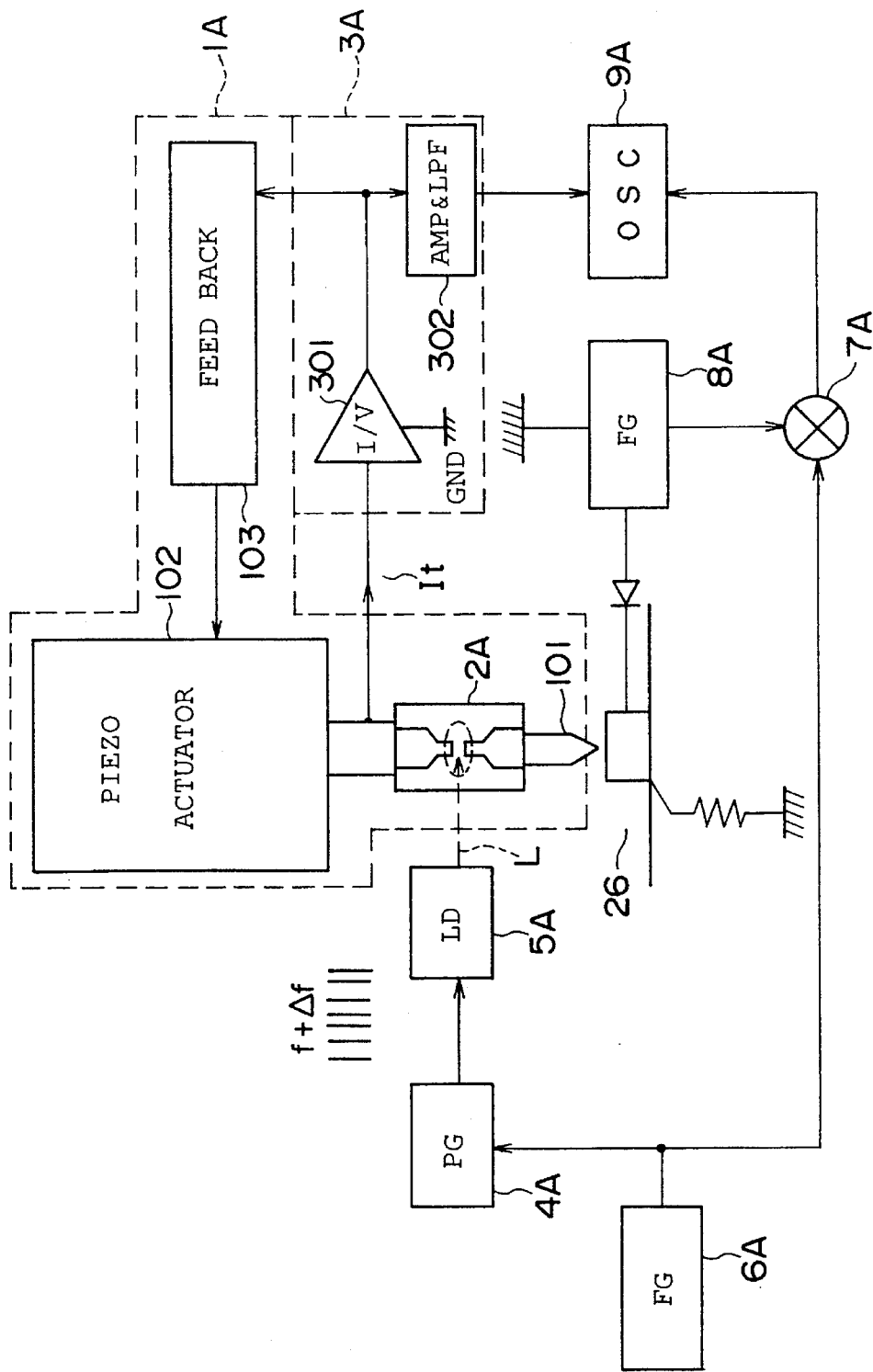
FIG. 1 is a constitutional view of a non-contact probe type of LSI inspection apparatus in which a scanning tunnel microscope according to a conventional example is applied.
Figure 2:
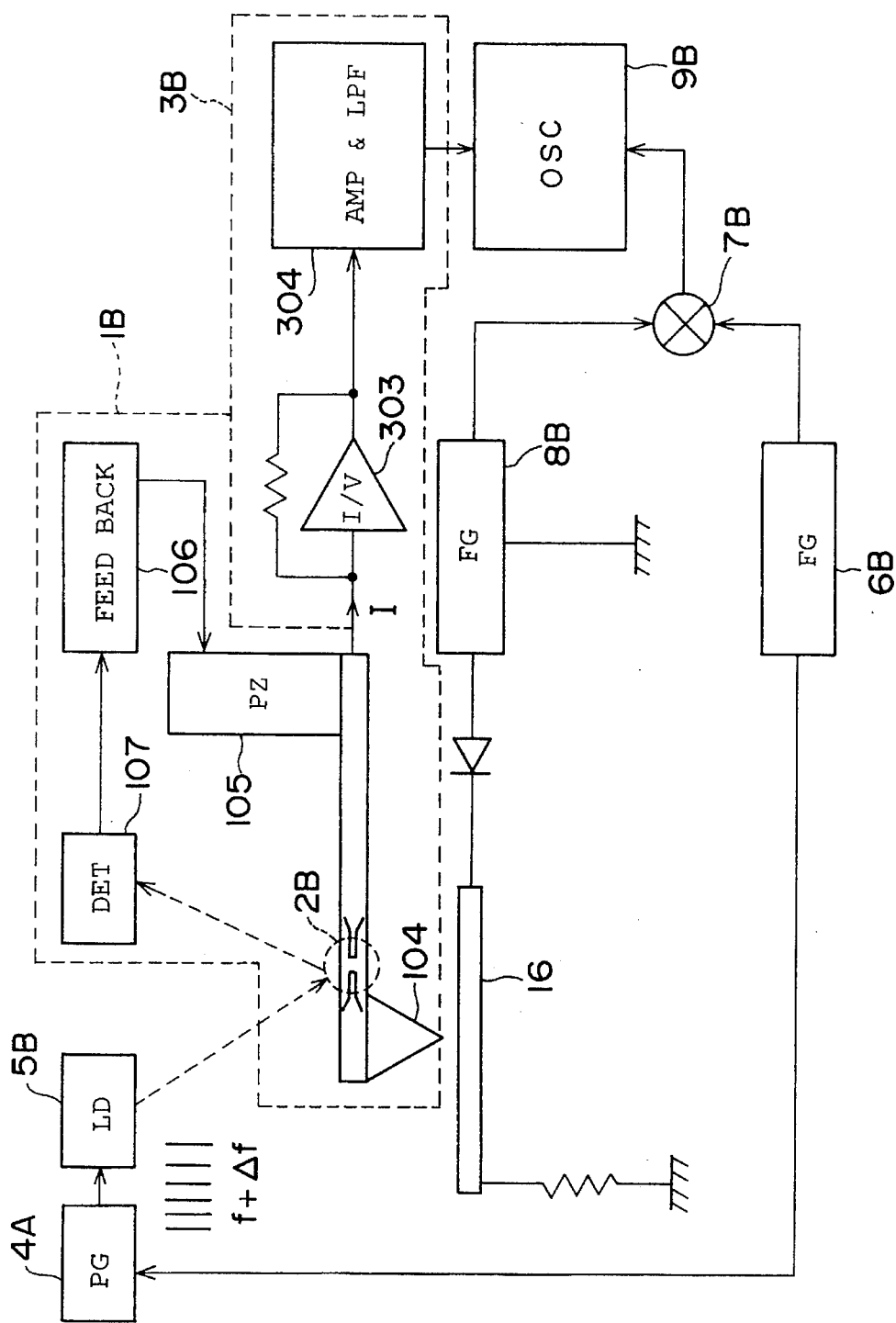
FIG. 2 is a constitutional view of a contact probe type of LSI inspection apparatus in which an inter-atomic force microscope according to a conventional example is applied.
Figure 3:
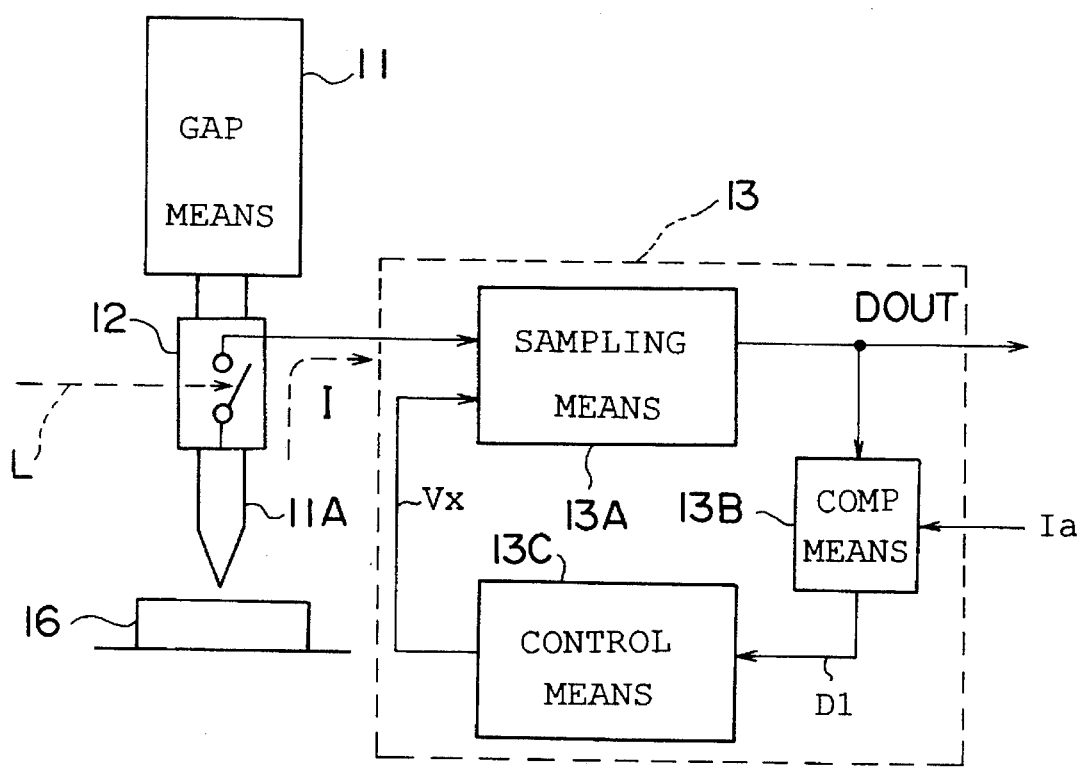
FIG. 3 is a constitutional view showing a principle of a signal measuring apparatus according to the present invention.

In a first signal measuring apparatus according to the present invention, as shown in FIG. 3, a distance between a device (sample) 16 and a probe 11A is adjusted, and an actuating signal existing in the device 16 is measured using a current I flowing when a voltage is applied through the device 16 and the probe 11A. That is, the first signal measuring apparatus comprises a sampling means 13A for sampling the current I flowing through the device 16 and the probe 11A according to a reference voltage Vx to obtain a sample value Dout, a comparing means 13B for comparing the sample value Dout obtained in the sampling means 13A and a current setting value $I_a$ arbitrary set, and a control means 13C for receiving an output signal of the comparing means 13B, generating the reference voltage Vx according to the output signal, feeding back the reference voltage Vx to the sampling means 13A and controlling the current flowing through the device 16 and the probe 11A using the reference voltage Vx to converge a value of the current I at the current setting value $I_a$. Therefore, the actuating signal of the device 16 being measured according to the reference voltage Vx on condition that the current I is converged at the current setting value $I_a$.

Also, in cases where the sample value Dout is higher than the current setting value $I_a$, the reference voltage Vx is generated in the control means 13C to reduce the sample value Dout. To the contrary, in cases where the sample value Dout is lower than the current setting value $I_a$, the reference voltage Vx is generated in the control means 13C to increase the sample value Dout.

An operation of the first signal measuring apparatus according to the present invention is described. A distance between the device 16 and the probe 11A is adjusted by an adjusting means 11 to place the probe 11A unlimitedly close to the device 16. In this condition, when a voltage is applied through the device 16 and the probe 11A by the sampling means 13A, a current I flows through the device 16 and the probe 11A. In this case, the current I varies according to an actuating signal which actuates the device 16. Thereafter, the current I is sampled according to the reference voltage Vx in the sampling means 13A, and a sampling result is output to the comparing means 13B as sample value Dout. As a modification, there is a case that the sample value Dout is stored in a memory.

Thereafter, the sample value Dout transferred from the sampling means 13A is compared in the comparing means 13B with a current setting value $I_a$ arbitrarily set, and the sample value Dout of the comparing means 13B is input to the control means 13C. In the control means 13C, in cases where the sample value Dout is higher than the current setting value $I_a$, the reference voltage Vx is generated to reduce the sample value Dout. To the contrary, in cases where the sample value Dout is lower than the current setting value $I_a$, the reference voltage Vx is generated to increase the sample value Dout. The reference voltage Vx is fed back from the control means 13C to the sampling means 13A.

As a result, because the current I is sampled according to the reference voltage Vx in the sampling means 13A to converge the sample value Dout at the current setting value $I_a$, the voltage of the device 16 can be measured using the reference voltage Vx on condition that the sample value Dout is converged at the current setting value $I_a$. For example, an actuating voltage VX of the device 16 is set to zero, and the current setting value $I_a$ is set. In this case, when a value of the current I is converged at the current setting value $I_a$ in case of a reference voltage Vx=V1, the reference voltage V1 is a relative voltage in case of the actuating voltage VX=0 of the device 16 and is a voltage on condition that the current I is not changed by the actuating voltage VX=0.

Also, for example, an actuating voltage VX of the device 16 is set to VX0, and the current setting value $I_a$ is set. In this case, when a value of the current I is converged at the current setting value $I_a$ in case of a reference voltage Vx=V2, In this case, when a value of the current I is converged at the current setting value $I_a$ in case of a reference voltage Vx=V2, the reference voltage V2 is a relative voltage in case of the actuating voltage VX0 of the device 16 and is a voltage on condition that the current I is charged by the actuating voltage VX0. Therefore, the voltage of the device 16 can be calculated using the values V1 and V2 of the reference voltage Vx.

Here, the current changed by the actuating signal of the device 16 is also converged at the current setting value $I_a$, and an actuating waveform of the device 16 can be reproduced using the change of the reference voltage Vx in a converging process (a first signal measuring method).

As is described above, in the present invention, because the current I to be sampled can be converged at the current setting value $I_a$ according to the reference voltage Vx, even though a current flowing through the device 16 and the probe 11A is a tunnel current $I_t$ having a very low intensity, the tunnel current $I_t$ can be processed with a high accuracy by a signal processing means 13 comprising the sampling means 13A, the comparing means 13B and the control means 13C.

Therefore, for example, even though an actuating signal of the device 16 has an amplitude larger than a prescribed amplitude on condition that the current I flowing through the device 16 and the probe 11A exceeds a tunnel region, because the current I can be converged at the current setting value $I_a$, an absolute voltage of the device 16 can be measured using the reference voltage Vx obtained when the current I flowing through the device 16 and the probe 11A is converged at the current setting value $I_a$.

In the first apparatus according to the present invention, because the current I flowing through the device 16 and the probe 11A passes through a photoconductive element 12, which is excited by receiving a beam of light L and is instantaneously set in a conductive condition is arranged, before the current I passes through the sampling means 13A, the current I, for example, representing a tunnel current $I_t$ which is changed by the actuating signal of the device 16 can be chopped in the photoconductive element 12, and the current I chopped can be input into the sampling means 13A.

Figure 4:
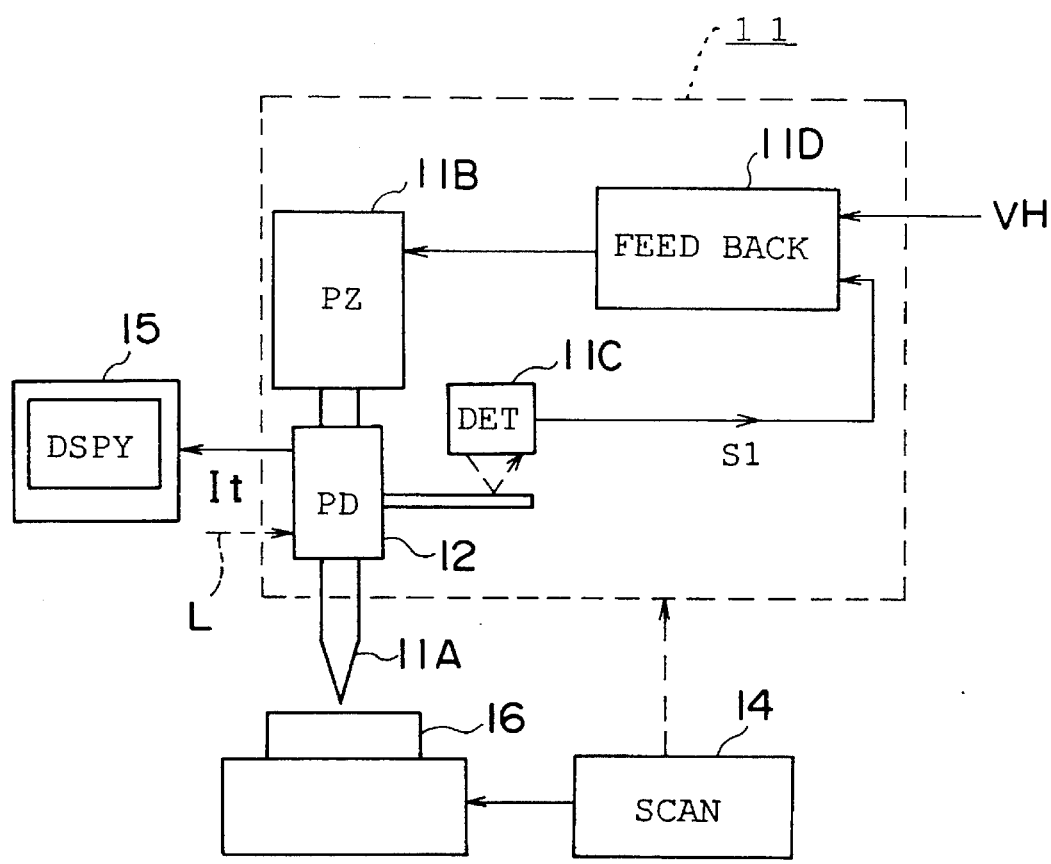
FIG. 4 is a constitutional view showing a principle of another signal measuring apparatus according to the present invention.

In a second signal measuring apparatus according to the present invention, as shown in FIG. 4, the adjusting means 11 comprises a piezo element 11B for actuating the probe 11A, a detecting element 11C for detecting a displacement of the probe 11A and outputting a displacement detecting signal S1, and a feed back actuating element 11D for controlling the output of the piezo element 11B according to the displacement detecting signal S1.

In the above configuration, when the probe 11A of the adjusting means 11 is moved along a height direction by the piezo element 11B, a displacement of the probe 11A is detected by the detecting element 11C, and a displacement detecting signal S1 is generated. The displacement detecting signal S1 is output to the feed back actuating element 11D, and an output of the piezo element 11B is controlled by the feed back actuating element 11D according to the displacement detecting signal S1. As a result, the current I which flows through the device 16 and the probe 11A and, for example, represents the tunnel current $I_t$ is controlled to a constant value. Therefore, the current I can be sampled with a high accuracy according to the reference voltage Vx.

In a third signal measuring apparatus according to the present invention, as shown in FIG. 4, a scanning means 14 for scanning either the adjusting means 11 and the device 16 and a displaying means 15 for outputting a piece of image information of the device 16 according to a displacement degree of the probe 11A obtained by the scanning of the scanning means 14 are additionally arranged. In the above configuration, a surface image of the device 16 and a waveform of the voltage of the device 16 can be obtained at the same time.

In a fourth signal measuring apparatus according to the present invention, the adjusting means 11 has a probe 11A with a cantilever to operate the probe 11A according to a cantilever method. Even though the probe 11A is used, a tunnel current $I_t$ having a very low intensity or the like can be sampled according to the reference voltage Vx in the signal processing means 13 according to the present invention. There is no probability that the probe 11A forcibly breaks though an insulating oxide film formed in the air or the like on the device 16 and the device 16 is forcibly pressed down by the cantilever of the probe 11A in the same manner as in the prior art. Also, because the device 16 can be probed with the probe 11A placed on an oxide film remaining on the device 16, metallic surfaces such as a needle top portion of the probe 11A in contact with the oxide film and a wiring pattern of the device 16 can be protected in a prescribed shape.

In a fifth signal measuring apparatus according to the present invention, the adjusting means 11 has a probe 11A with a vertical needle supported by a spring plate to operate the probe 11A according to a vertical needle method. Even though the prove 11A is used, an ohmic current I having a very low intensity can be sampled according to the reference voltage Vx in the signal processing means 13 according to the present invention. Therefore, a top end current of the probe 11A can be arbitrarily set using the current setting value $I_a$. That is, there is no probability that the current I is definitely determined according to a contact resistance and an input impedance of a current/voltage converter of a signal processing means in the same manner as in the prior art.

Also, even though an insulating layer such as an air-oxide film remains on the device 16, a tunnel current $I_t$ can be sampled according to the reference voltage Vx, an ohmic contact resistance occurring when the photoconductive element 12 is set in an "on" condition can be comparatively enlarged, the ohmic contact resistance does not function as a circuit load of the device 16. Also, it is not required to forcibly push the probe 11A onto the device 16. Therefore, a needle point of the probe 11A can be maintained in a prescribed sharp shape.

Figure 5:
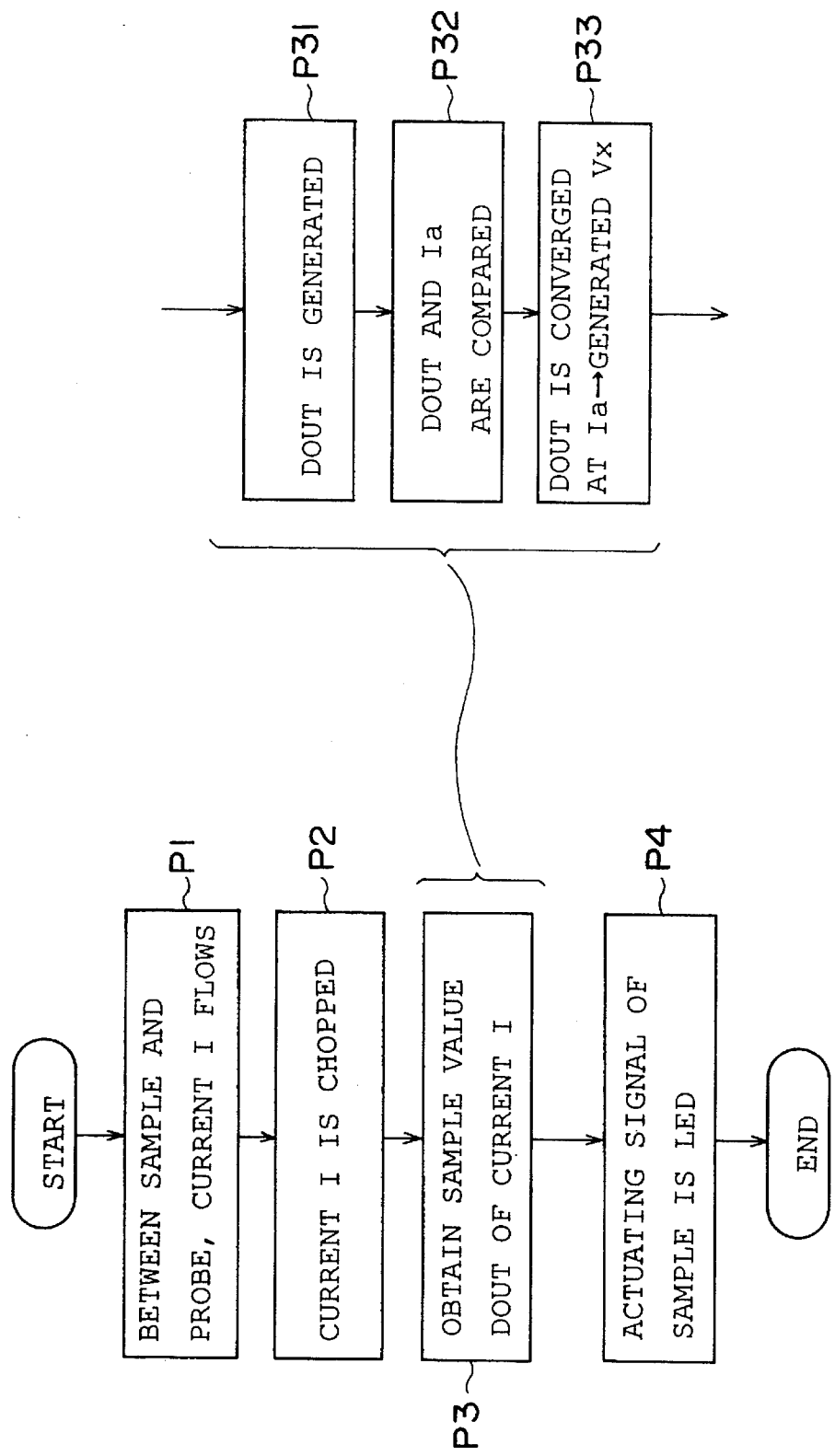
FIG. 5 is a measuring flow chart showing a principle of a signal measuring method according to the present invention.

A first signal measuring method according to the present invention is a method that an actuating signal of a sample is measured using a probe. That is, a value of a current flowing through the device 16 and the probe 11A is set in advance. When the actuating signal of the device 16 is measured, as a processing flow chart is shown in FIG. 5, a distance between the device 16 and the probe 11A is initially adjusted in a step P1, a voltage is applied through the device 16 and the probe 11A, and a current I flows. For example, a tunnel current $I_t$ is generated through the device 16 and the probe 11A. Thereafter, the current I is chopped according to a beam of light L having a short wavelength in a step P2.

To chop the current I, a photoconductive element which is excited by receiving the light L and is instantaneously excited to a conductive state is utilized. Thereafter, in a step P3, the current I flowing through the device 16 and the probe 11A is sampled according to a reference voltage Vx, on which the calculation of an absolute voltage of the device 16 is based, to obtain a sample value Dout of the current I.

In this sampling operation of the first signal measuring method according to the present invention, the sample value Dout is generated in a step P31 by inputting the current I and the reference voltage Vx. Thereafter, the sample value Dout and the current setting value $I_a$ are compared with each other in a step P32. Thereafter, the reference voltage Vx with which the sample value Dout is converged at the current setting value $I_a$ is generated according to a compared result in a step P33.

In the step P33, when the sample value Dout is higher than the current setting value $I_a$, the reference voltage Vx with which the sample value Dout is reduced is generated. To the contrary, when the sample value Dout is lower than the current setting value $I_a$, the reference voltage Vx with which the sample value Dout is increased is generated.

Thereafter, in a step P4, the sample value Dout is converged at the current setting value $I_a$ while reducing the sample value Dout according to the reference voltage Vx, and the actuating signal of the device 16 is led by the reference voltage Vx of which a value varies in a converging process.

In the first signal measuring method according to the present invention, as the processing flow chart is shown in FIG. 5, because the current I sampled in the step P3 can be converged at the current setting value $I_a$ according to the reference voltage Vx, a tunnel current $I_t$ having a very low intensity expressed by a nano ampere unit can be treated with a high accuracy.

For example, in the step P4, a high speed actuating signal of the device 16 can be reproduced using a sample value Dout which is obtained by converting the current I chopped in synchronization with a trigger signal in a current/voltage converter (a fourth signal measuring method). Therefore, an absolute voltage of the actuating signal can be measured using the actuating signal of the device 16 reproduced.

Also, as for the calculation of the sample value Dout, an offset voltage Voff is calculated using first and second values V1 and V2 of the reference voltage Vx (a fifth signal measuring method), and the offset voltage Voff is subtracted from the reference voltage Vx which determines the sample value Dout of the device 16 (a sixth signal measuring method).

In a third signal measuring method of the present invention, the probe 11A is pushed onto the device 16 in a sampling operation to set the probe 11A in ohmic contact with the device 16, and the current I is generated depending on the ohmic contact of the probe 11A with the device 16.

In a fourth signal measuring method of the present invention, in a sampling operation, a plurality of trigger signals are generated to changeably use a measuring phase for the actuating signal of the device 16, and the current flowing through the device 16 and the probe 11A is processed in on-off control according to a laser beam L radiated in synchronization with one of the trigger signals.

In a fifth signal measuring method of the present invention, in a sampling operation, a supplying signal transferred to the device 16 is fixed, and the reference voltage Vx for the device 16 is swept to obtain a first value V1 of the reference voltage Vx which minimizes a value of the current I flowing through the device 16 and the probe 11A and to obtain a second value V2 of the reference voltage Vx determined when the current I is converged at the current setting value $I_a$. Thereafter, an offset voltage Voff is calculated using the first and second values V1 and V2 of the reference voltage Vx.

In a sixth signal measuring method of the present invention, in a sampling operation, the reference voltage Vx is obtained using the sample value Dout of the current I which varies according to a supplying signal transferred to the device 16. Thereafter, an offset voltage Voff is subtracted from the reference voltage Vx. Therefore, an absolute voltage of the device 16 can be measured.

Next, preferable embodiments according to the present invention are described with reference to drawings.

Figure 6:
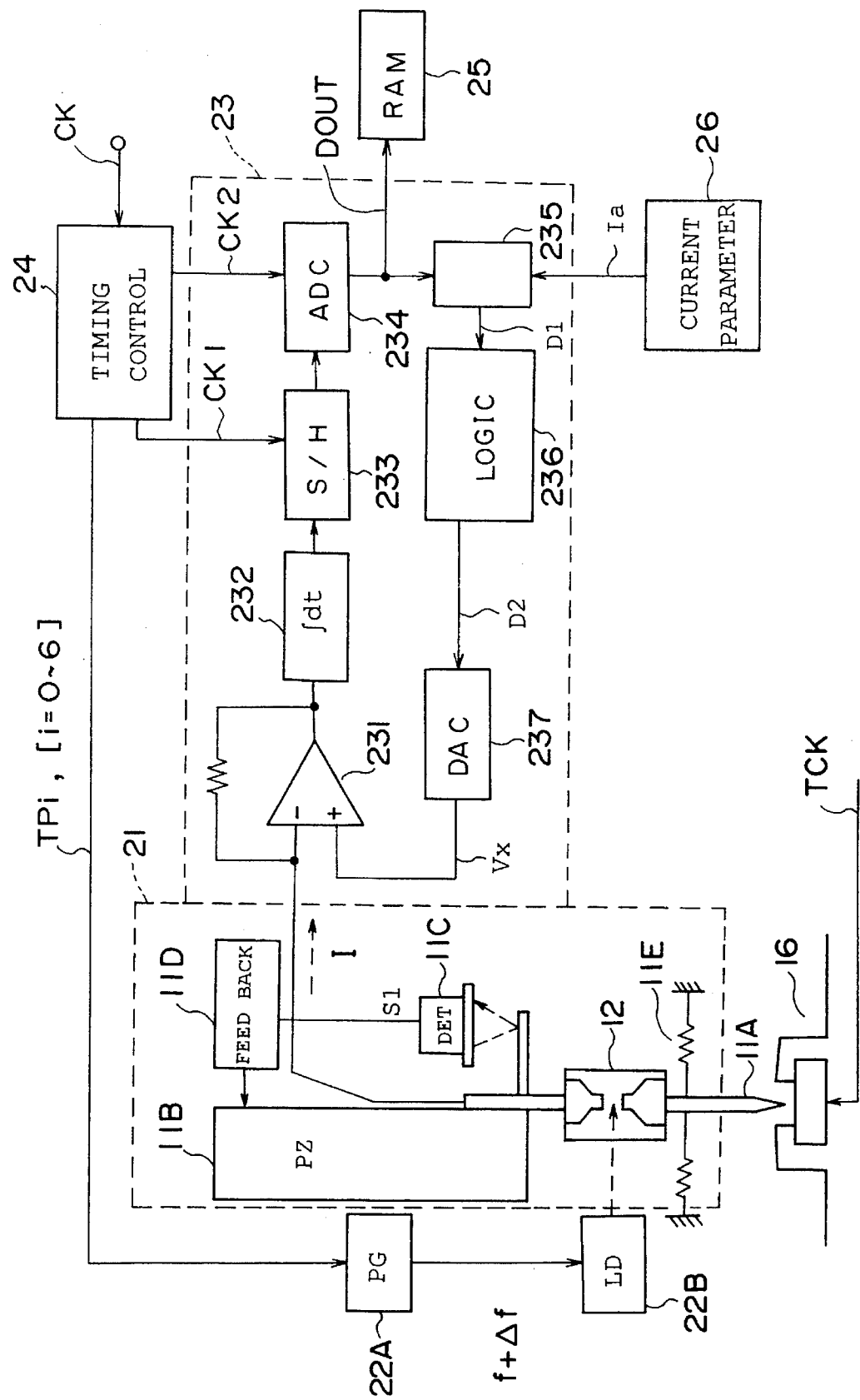
FIG. 6 is a constitutional view of a voltage waveform measuring apparatus in which a scanning tunnel microscope according to a first preferable embodiment of the present invention is applied.

FIG. 6 is a constitutional view of a non-contact type of voltage waveform measuring apparatus, in which the first, second and third signal measuring apparatuses according to the present invention are combined, operated according to a vertical needle method.

In FIG. 6, 21 denotes a piezo actuator for adjusting a distance between the device 16 and the probe 11A. The piezo actuator 21 is an example of the adjusting means 11. For example, the piezo actuator 21 comprises the probe 11A operated according to a vertical needle method, the piezo element 11B, the detecting element 11C, the feed back actuating element 11D, a plate spring supporting element 11E and the photoconductive element 12.

A measuring point of the device 16 is probed by the probe 11A. The probe 11A is attached to the piezo element 11B, and the probe 11A is moved in a height direction by the piezo element 11B according to a piezo electric effect. A displacement of the probe 11A is detected by the detecting element 11C, and a displacement detecting signal S1 is output to the feed back actuating element 11D. In the feed back actuating element 11D, an output of the piezo element 11B is controlled, for example, to set the distance between the device 16 and the probe 11A to a constant value according to the displacement detecting signal S1. The probe 11A is supported laterally by the plate spring supporting element 11E.

Figure 7:
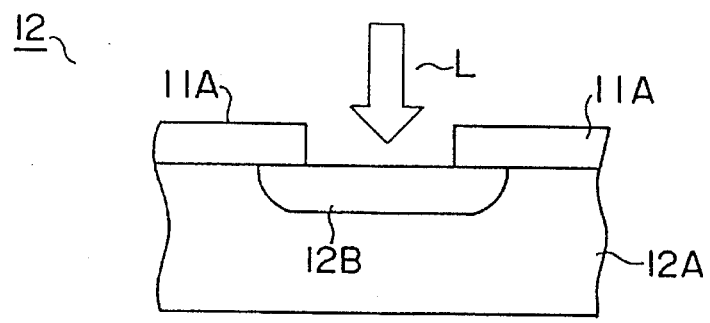
FIG. 7 is a cross sectional view of a photoconductive element of the voltage waveform measuring apparatus shown in FIG. 6.

12 denotes a photoconductive element for chopping a current I flowing through the device 16 and the probe 11A. The photoconductive element 12 is placed in the middle of the probe 11A. For example, as shown in FIG. 7, the photoconductive element 12 comprises a Si substrate 12A and a semi-insulating layer 12B such as a GaAsInP or the like, and a first portion of the probe 11A and a second portion of the probe 11A are placed on right and left (or upper and lower) ends of the semi-insulating layer 12B to be spaced at a regular interval. Therefore, the first and second portions of the probe 11A are electrically separated on condition that any beam of light is not radiated to the semi-insulating layer 12B. When a laser beam L having a short wavelength is radiated to the semi-insulating layer 12B, a region of the semi-insulating layer 12B is excited and instantaneously set in a conductive condition, and the first and second portions of the probe 11A separated at the right and left (or upper and lower) ends of the semi-insulating layer 12B are electrically connected. In contrast, when the laser beam L is not radiated to the semi-insulating layer 12B, the photoconductive element 12 holds an insulation performance.

22A denotes a pulse oscillator (or a pulse generator) for generating a series of pulses having a frequency f+Δf according to trigger signals TPi (i=0 to 6). In this embodiment, as shown in FIG. 11, a reference phase φ0 is set for a low level "L" of a clock signal TCK with which the device 16 is operated, and six measuring phases φ1 to φ6 are set by referring the reference phase φ0. The trigger signals TP0 to TP6 are used to set the reference phase φ0 and the measuring phases φ1 to φ6. The laser beam L is generated by a laser diode 22B representing a laser light source according to the series of pulses f+Δf.

23 denotes a sampling apparatus for sampling the current I according to a reference voltage Vx which is used as a basis for the calculation of an actuating signal of the device 16. The sampling apparatus 23 is an example of the signal processing means 13. For example, the sampling apparatus 23 comprises an I/V converter 231, an integrator 232, a sample holding circuit 233, an A/D converter 234, a comparator 235, a control logic circuit 236 and a D/A converter 237.

Figures 8, 8A:
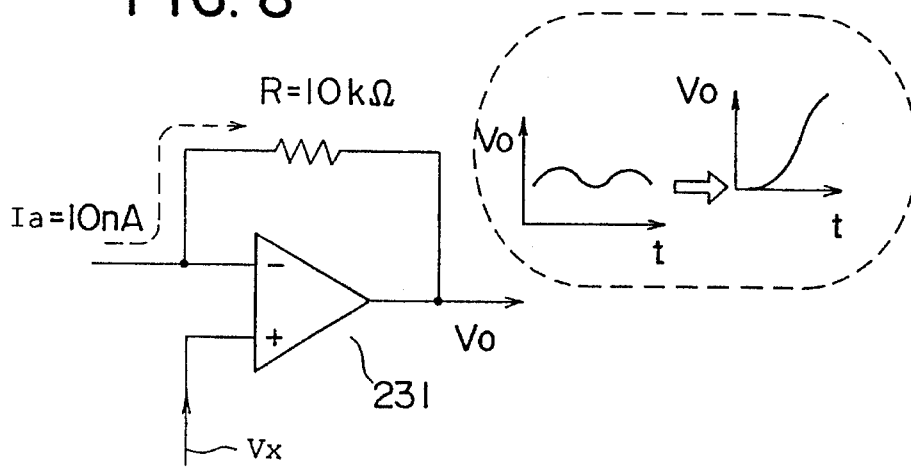
FIG. 8 is an explanatory view showing an operation of an I/V converter of the voltage waveform measuring apparatus shown in FIG. 6.

A combination of the I/V converter 231, the integrator 232, the sample holding circuit 233 and the A/D converter 234 is an example of the sampling means 13A shown in FIG. 3. The reference voltage Vx is input to the I/V converter 231 as a standard voltage, and the current I is converted into a sample voltage Vo in the I/V converter 231. For example, as shown in FIG. 8, the I/V converter 231 is formed of an operational amplifier, and the sample voltage Vo is set to a value Vx=Ia*R. Here, the symbol R is a value of a feed-back resistor R, and the symbol $I_a$ is a current setting value. In this embodiment, when the current I is set to 10 nA and the feed-back resistor R is set to about 10 kΩ(ohm), the reference voltage Vx is about 5 V.

Also, the current I flowing from the probe 11A is input to a minus terminal of the I/V converter 231, and the reference voltage Vx is input to a plus terminal of the I/V converter 231. On condition that an actuating voltage in the device 16 is fixed, an intensity of the current I fetched into the I/V converter 231 is reduced as the reference voltage Vx is increased. In contrast, an intensity of the current I is increased as the reference voltage Vx is reduced. This function of the I/V converter 231 results from a performance of a differential amplifying circuit composing the I/V converter 231.

The integrator 232 is composed of a low pass filter. In the integrator 232, the sample voltage Vo is integrated, and a high frequency component is removed. The sample holding circuit 233 is composed of a sample capacitor and a sampling switch to sample the sample voltage Vo. An on-off operation of the sampling switch is performed according to a clock signal CK1. In the A/D converter 234, the sample voltage Vo charged in the sample capacitor is A/D-converted according to a clock signal CK2, and a sample value Dout is generated.

The comparator 235 is an example of the comparing means 13B. In the comparator 235, the sample value Dout and a current setting value $I_a$ are compared with each other, and a piece of compared result data D1 is output to the control logic circuit 236.

Figure 9:
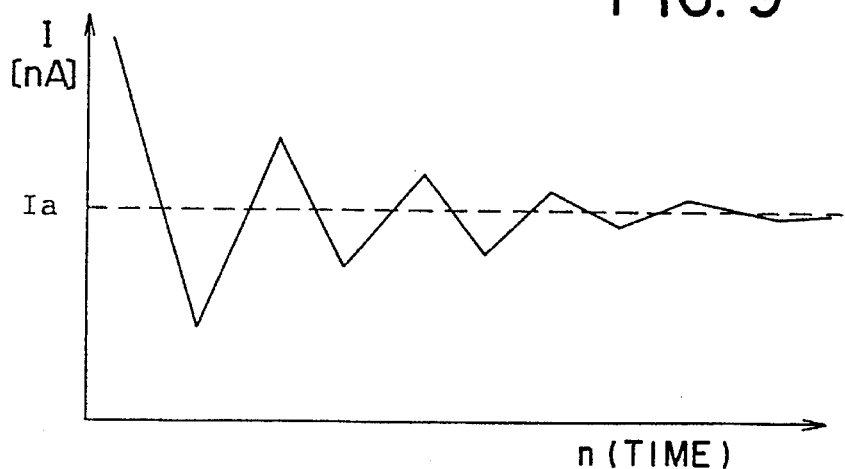
FIG. 9 shows a relationship between a current input into the I/V converter of the voltage waveform measuring apparatus shown in FIG. 6 and the number of feed-back operations of a reference voltage.

A combination of the control logic circuit 236 and the D/A converter 237 is an example of the control means 13C. In the control logic circuit 236, the compared result data D1 is decoded to form a piece of control data D2, and the control data D2 is output to the D/A converter 237. As shown in FIG. 9, contents of the control data D2 are formed of pieces of control data with which the current I is converged at the current setting value $I_a$ by repeating n times a sampling operation (or a feed-back operation). In FIG. 9, the current I is indicated as a y coordinate axis, and the number n of sampling operations repeated is indicated as an x coordinate axis. A solid line indicates the change of the current I fetched into the I/V converter 231 with respect to the number n of sampling (feed-back) operations, and a broken line indicates the current setting value $I_a$.

For example, in cases where the compared result data D1 changes toward a plus direction because the sample value Dout higher than the current setting value $I_a$ is obtained, the control data D2 for leading the comparing result data D1 toward a minus direction is output from the control logic circuit 236. In contrast, in cases where the compared result data D1 changes toward the minus direction because the sample value Dout lower than the current setting value $I_a$ is obtained, the control data D2 for leading the comparing result data D1 toward the plus direction is output from the control logic circuit 236. In the D/A converter 237, the reference voltage Vx expressed in analog is generated according to the control data D2 and is output to the I/V converter 231.

24 denotes a timing generating circuit for generating the trigger signals TPi and the clock signal CK1, CK2 according to a reference clock signal CK and outputting the signals to the pulse oscillator 22A, the sample holding circuit 233 and the A/D converter 234. 25 denotes a random access memory (RAM) for storing the sample value Dout. 26 denotes a register for holding the current setting value $I_a$. The current setting value $I_a$ is used as a current setting parameter of the probe 11A. In this embodiment, a tunnel current $I_t$ is set to about 10 nA.

Next, an operation of the voltage waveform measuring apparatus according to the present invention is described according to a voltage waveform measuring method which relates to each of embodiments of the present invention.

Figure 10:
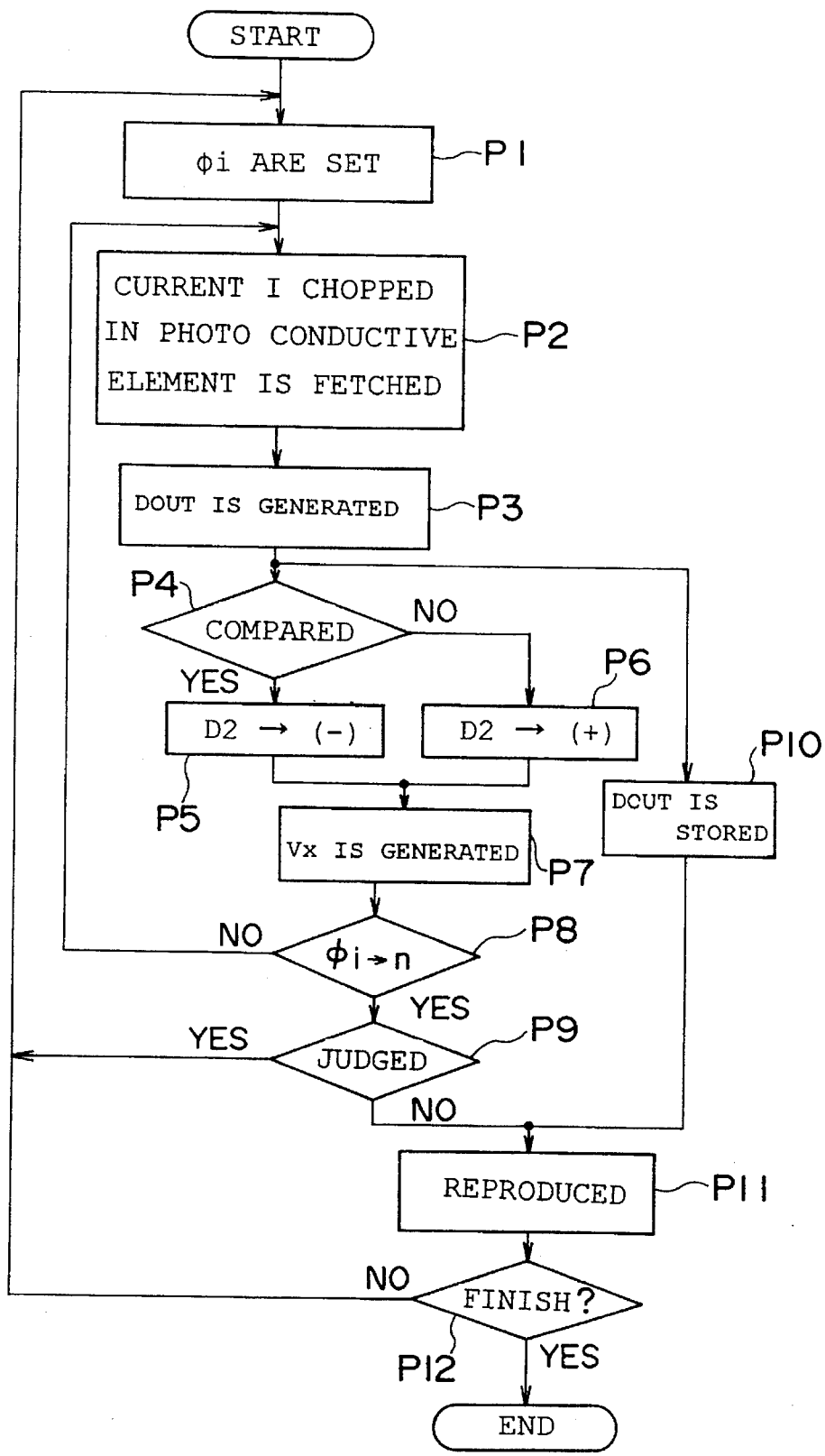
FIG. 10 is a measuring flow chart of a voltage waveform according to each of embodiments of the present invention.

For example, a tunnel current $I_t$ flowing through the device 16 and the probe 11A is monitored, and a voltage waveform of the device 16 operated according to the clock signal TCK is measured. In this case, as a flow chart is shown in FIG. 10, the measuring phases $\phi i$ are set by referring the reference phase $\phi 0$ in a step P1. Therefore, a laser beam L chopped in synchronization with the trigger signals TP1 to TP6 can be generated by generating the trigger signals TP1 to TP6 in which the measuring phases $\phi 1$ to $\phi 6$ determined by referring the reference phase $\phi 0$ of an actuating signal in the device 16 are set.

Also, by setting the measuring phases $\phi i$, the trigger signal TP0 and the clock signals CK1 and CK2 according to the reference clock signal CK are generated in the timing generating circuit 24, and the signals TP0, CK1 and CK2 are output to the pulse oscillator 22A, the sample holding circuit 233 and the A/D converter 234.

Thereafter, the current I chopped in the photoconductive element 12 is input into the I/V converter 231 in a step P2. In this case, the probe 11A is positioned on a measuring point of the device 16 and is moved along a height direction by the piezo element 11B, and the device 16 is probed by the probe 11A. Thereafter, a displacement of the probe 11A is detected in the detecting element 11C, and a displacement detecting signal S1 is output to the feed back actuating element 11D. An input to the piezo element 11B is controlled by the feed back actuating element 11D according to the displacement detecting signal S1. Therefore, the tunnel current $I_t$ is controlled to a constant value.

Also, a series of pulses having a frequency $f+\Delta f$ is generated according to the trigger signal TP0 in the pulse oscillator 22A, and the laser beam L is generated according to the series of pulses in the laser diode 22B. The photoconductive element 12 is excited by the laser beam L, and the probe 11A is instantaneously excited to in a conductive condition. Therefore, the tunnel current $I_t$ flowing through the device 16 and the probe 11A is chopped (the fourth signal measuring method).

It is applicable that the probe 11A be pushed onto the device 16 to be in ohmic contact with the device 16 for the purpose of generating the current I flowing through the device 16 and the probe 11A according to the ohmic contact (a third signal measuring method).

Thereafter, a sample value Dout is generated according to the current I or the tunnel current $I_t$ and the reference voltage Vx in a step P3. For example, the tunnel current $I_t$ is converted into a sample voltage Vo by the I/V converter 231 while using the reference voltage Vx as a standard voltage. A value of the sample voltage Vo for the measuring phase $\phi i$ is Vx=Ia·R. This value is not an absolute voltage.

Also, the sample voltage Vo is integrated in the integrator 232, and the sample voltage Vo integrated is charged into the sample capacitor of the sample holding circuit 233 according to the clock signal CK1. Thereafter, the sample voltage V0 charged is A/D-converted into a sample value Dout according to the clock signal CK2 in the A/D converter 234.

Therefore, the tunnel current $I_t$ chopped according to the reference voltage Vx which is used as a basis for the calculation of a measured voltage of the device 16 can be sampled.

Thereafter, the sample value DOUT is compared with the current setting value $I_a$ in a step P4. In this case, when the sample value Dout is higher than the current setting value $I_a$ (YES), the procedure proceeds to a step P5, and the control data D2 is decreased. In contrast, when the sample value Dout is lower than the current setting value $I_a$ (NO), the procedure proceeds to a step P6, and the control data D2 is increased.

When the current setting value $I_a$ is transferred from the register 26 to the comparator 235, the sample value Dout is compared with the current setting value $I_a$ in the comparator 235, and a piece of compared result data D1 is output to the control logic circuit 236. In the control logic circuit 236, the compared result data D1 is decoded to form a piece of control data D2, and the control data D2 is output to the D/A converter 237.

Thereafter, a reference voltage Vx with which the sample value Dout is converged at the current setting value $I_a$ is generated according to a compared result (or the control data D2) in a step P7. For example, contents of the control data D2 are formed of pieces of control data with which the current I is converged at the current setting value $I_a$ by repeating n times a sampling operation (or a feed-back operation) shown in FIG. 9. In cases where the compared result data D1 changes in a plus direction, the control data D2 for leading the comparing result data D1 toward a minus direction is output from the control logic circuit 236 to the D/A converter 237. In contrast, in cases where the compared result data D1 changes toward the minus direction, the control data D2 for leading the comparing result data D1 toward the plus direction is output from the control logic circuit 236 to the D/A converter 237. Thereafter, the reference voltage Vx is generated in the D/A converter 237 according to the control data D2 and is output to the I/V converter 231.

Thereafter, it is determined in a step P8 whether or not the number of sampling operations for a particular measuring phase $\phi i$ reaches n. For example, in cases where the sampling operation for the measuring phase $\phi 1$ is performed n times (YES), the procedure proceeds to a step P9. In contrast, in cases where the sampling operation for the measuring phase $\phi 1$ is not repeatedly performed n times (NO), the procedure returns to the step P2, the current I is fetched into the I/V converter 231, and the sampling operation is continued. Therefore, many sampling operations are performed in one cycle prescribed by the reference phase $\phi 0$ and the measuring phase $\phi 1$. In this case, as shown in FIG. 9, in a period that the sampling operation is repeated in a range from several times to several hundreds times, the reference voltage Vx is comparatively dynamically changed each time the sampling operation is performed, and the current I is repeatedly input. Thereafter, as the number of sampling operations approaches n, the change of the reference voltage Vx is small to set the current I to an appropriate value.

Thereafter, it is determined in the step P9 whether or not the particular measuring phase φi is changed to another one. In this case, for example, in cases where the measuring phase φ1 is intended to be changed to φ2 (YES), the procedure returns to the step P1, and the measuring phase φ2 is newly set. In the same manner, the sampling operations for the remaining measuring phases φ3 to φ6 are performed. In contrast, in cases where the particular measuring phase φi is not changed in the step P9 (NO), the procedure proceeds to a step P11. Also, the sample value Dout obtained in the step P3 is stored in a memory in a step P10. The sample value Dout stored in the memory is repeatedly added each time the sampling operation is performed. The RAM 25 is used as the memory, and the sample value Dout is repeatedly stored in the RAM 25 appropriate times n to obtain an accumulated value. Therefore, a ratio of signal to noise (S/N ratio) for the sample value Dout can be improved.

In the step P11, a voltage waveform of the device 16 is reproduced. For example, as shown in FIG. 11, pieces of calculation data for each of the measuring phases φ0 to φ6 which are obtained by the trigger signals TP0 to TP6 are plotted, and a voltage waveform VX of the device 16 is reproduced. Here, a voltage Vr is an absolute value, and a voltage Voff is an offset voltage.

Thereafter, it is determined in a step P12 whether or not the measurement of the waveform is finished. In cases where the measurement of the waveform is not finished (NO), the procedure returns to the step P1, and the sampling operation is continued. In contrast, in cases where the measurement of the waveform is finished (YES), the measurement of the waveform is finished and the program is exited.

As is described above, as shown in FIG. 6, the signal measuring apparatus according to the first embodiment of the present invention comprises the piezo actuator 21, the pulse oscillator 22A, the laser diode 22B, the sampling apparatus 23, the timing generating circuit 24, the RAM 25 and the register 26.

Figure 13:
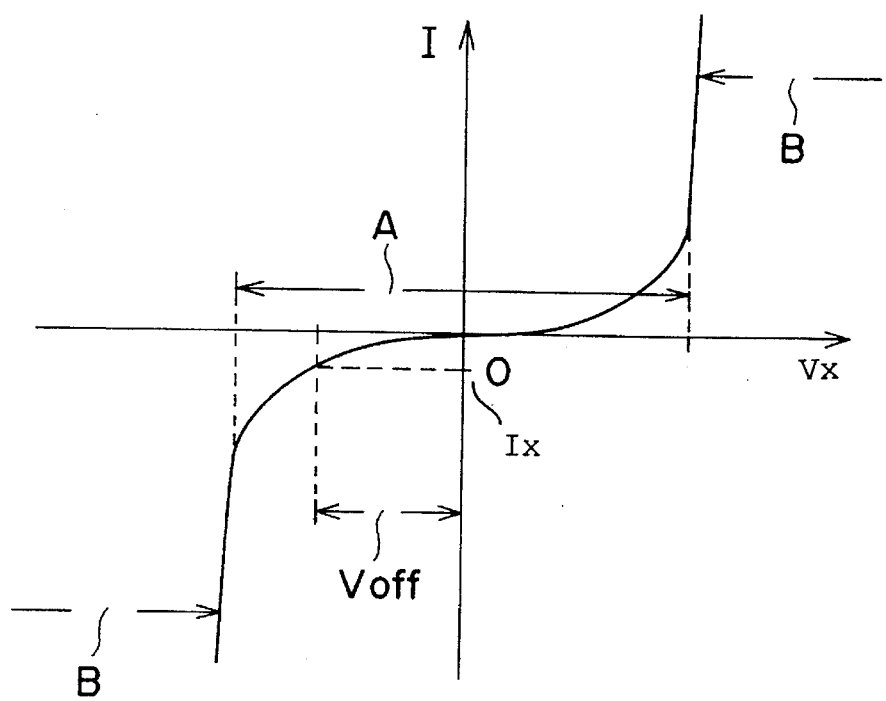
FIG. 13 shows another relationship between a current and a reference voltage of the signal supplementing the measuring flow chart shown in FIG. 10.

In the above configuration, because the tunnel current $I_t$ to be sampled is feedback-controlled according to the reference voltage Vx in the sampling apparatus 23, the tunnel current $I_t$ can be converged at the current setting value $I_a$. Therefore, as shown in FIG. 13, a desired current value which is equal to the current setting value $I_a$ and does not reach a dielectric breakdown region B can be set, and a sampling operation in which the tunnel current $I_t$ is converged at the current setting value $I_a$ in a tunnel region A can be performed. FIG. 13 shows a relationship between the current I and the reference voltage Vx in a tunnel current mode. The current I is indicated as a Y coordinate axis, and the reference voltage Vx is indicated as an X coordinate axis.

Accordingly, because the above sampling operation is performed, the tunnel current $I_t$ is converged at the current setting value $I_a$ according to the reference voltage Vx, a non-linearity that a value of an applied voltage for generating the tunnel current $I_t$ is not in proportion to a distance between the device 16 and the probe 11A does not adversely influence the measurement of the actuating signal existing in the device 16. Therefore, the measurement of a voltage waveform can be performed with a high accuracy.

Also, in the apparatus according to the present invention, because an output of the piezo element 11B of the piezo actuator 21 is controlled by the feed back actuator 11D according to the displacement detecting signal S1, the tunnel current $I_t$ flowing through the device 16 and the probe 11A can be controlled to a constant value, and the tunnel current $I_t$ can be sampled according to the reference voltage Vx with a high accuracy.

Also, in the apparatus according to the present invention, even though a resistance of the photoconductive element 12 is low when the element 12 is set in an "on" condition, a minute current at a top end of the probe 11A can be arbitrarily set by adjusting the current setting value $I_a$. Therefore, there is no probability that the current I is definitely determined in the prior art by the contact resistance and the input impedance of the I/V converter 231. Also, because an input of the I/V converter 231 can be set to a high impedance, there is no probability that an excessive load is given to the device 16.

Therefore, using the probe 11A having a vertical needle supported by a plate spring, because the device 16 can be accurately probed with the probe 11A without forcibly applying a force on an oxide film of the device 16, metallic surfaces such as a top portion of the probe 11A, a wiring of the device 16 and the like can be protected. Also, an actuating signal having no waveform deformation can be measured.

In a signal measuring method according to the present invention, as a measurement flow chart is shown in FIG. 10, a tunnel current $I_t$ occurring through the device 16 and the probe 11A is chopped by the function of the photoconductive element 12 in the step P2, and the tunnel current $I_t$ is sampled according to the reference voltage Vx in the step P3.

In the above method, because the current I to be sampled, which represents the tunnel current $I_t$ as an example, can be converged at the current setting value $I_a$ according to the reference voltage Vx, the tunnel current $I_t$ or the like having a very low intensity can be treated with a high accuracy.

Therefore, even though an actuating signal of the device 16 has an amplitude larger than a prescribed amplitude or even though the actuating signal is in an energy level exceeding a tunnel region, because the tunnel current $I_t$ is converged at the current setting value $I_a$, the measurement of a voltage linearly changing can be performed.

Figure 12:
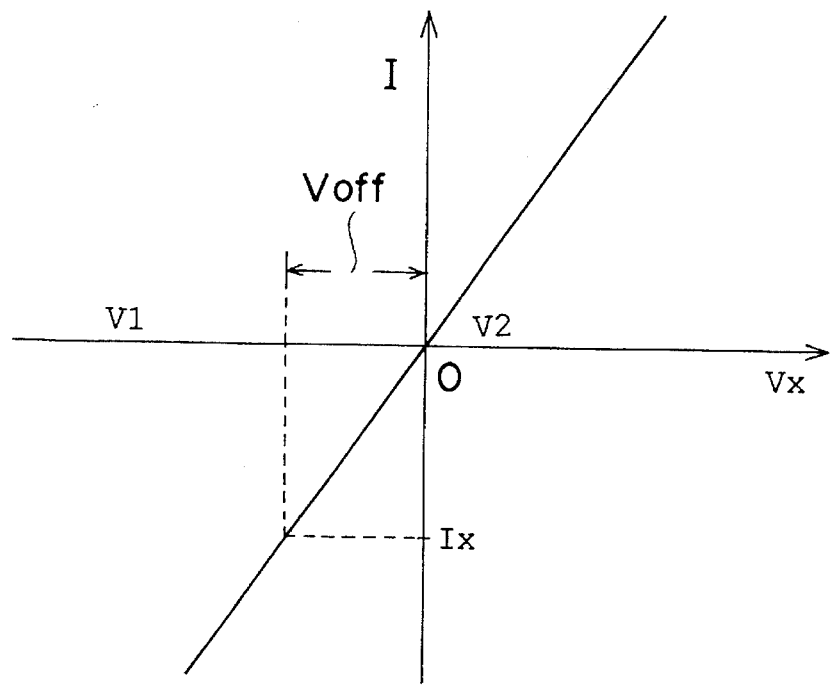
FIG. 12 shows a relationship between a current and a reference voltage of the signal supplementing the measuring flow chart shown in FIG. 10.

For example, the supply of the clock signal TCK to the device 16 is stopped, the reference voltage Vx is swept as shown in FIG. 12, and a value V1 of the reference voltage Vx at which a value of the current I is minimized is searched. Thereafter, a value V2 of the reference voltage Vx is searched when the current I is converged at the current setting value $I_a$, and an offset value Voff of the reference voltage Vx is calculated using the values V1 and V2 of the reference voltage Vx (the fifth signal measuring method). FIG. 12 shows a relationship between the current I and the reference voltage Vx. The current I is indicated as a Y coordinate axis, and the reference voltage Vx is indicated as an X coordinate axis.

Thereafter, when an actuating signal of the device 16 is measured, the clock signal TCK is applied to the device 16 as shown in FIG. 6 to give a change to the actuating signal, the reference voltage Vx is searched using the sample value Dout for the change of the actuating signal, and the offset value Voff of the reference voltage Vx is subtracted from the reference voltage Vx (the sixth signal measuring method). Therefore, even though the sampling operation is performed in a tunnel mode in the step P11 on condition that the probe 11A is not perfectly in ohmic contact with the device 16, an absolute voltage Vr=Vx-Voff of the device 16 can be measured with accuracy.

A second embodiment differs from the first embodiment in that a stage driver 34, a monitor 35 and a probe 31A operated according to a cantilever method are arranged according to the second embodiment.

Figure 14:
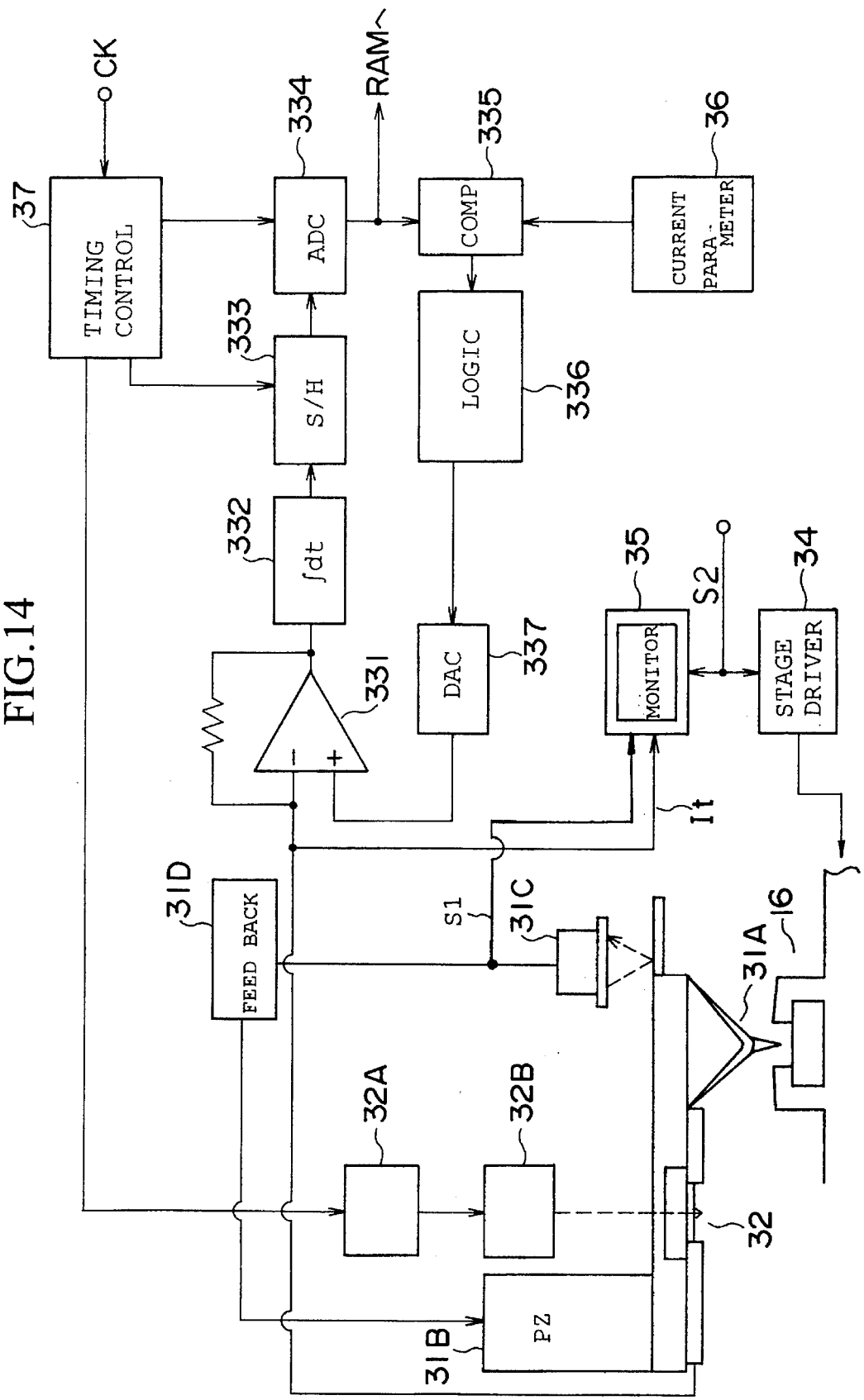
FIG. 14 is a constitutional view of a voltage waveform measuring apparatus in which an atomic force microscope according to a second embodiment of the present invention is applied.

That is, as shown in FIG. 14, a non-contact type of voltage waveform measuring apparatus, in which the first, third and fourth signal measuring apparatuses according to the present invention are combined, comprises the probe 31A operated according to a cantilever method, a piezo element 31B, a detecting element 31C, a feed back actuating element 31D, a photoconductive element 32, a pulse oscillator 32A, a laser diode (or a laser light source) 32B, an I/V converter 331, an integrator 332, a sample holding circuit 333, an A/D converter 334, a comparator 335, a control logic circuit 336, a D/A converter 337, the stage driver 34, the monitor 35, a register 36 and a timing generating circuit 37. Elements of which names are the same as those of elements in the first embodiment have the same functions as those of the elements in the first embodiment. Therefore, the description of the functions of the those elements in the second embodiment is omitted.

In the stage driver 34, the device 16 is scanned along X and Y directions according to an external control signal S2 input from a host control apparatus or the like. The stage driver 34 is an example of the scanning means 14, and the scanning means 14 is not limited to the stage driver 34. For example, it is applicable that a piezo actuator formed by combining the prove 31A operated according to a cantilever method, the piezo element 31B and the detecting element 31C be scanned by the scanning means 14. The external control signal S2 is a signal for controlling an output of the stage driver 34 and synchronizing the monitor 35 with the stage driver 34.

In the monitor 35, a piece of image information indicating a surface image of the device 16 is displayed according to a displacement of the probe 11A obtained by scanning the device 16 with the stage driver 34. The monitor 35 is an example of the displaying means 15. A tunnel current $I_t$ flowing through the device 16 and the probe 31A, a displacement detecting signal S1 and a piece of image information of the device 16 are displayed according to the external control signal S2 synchronizing with the stage driver 34. A degree of displacement of the probe 11A is obtained from the displacement detecting signal S1 detected in the detecting element 31C.

In the above configuration of the voltage waveform measuring apparatus, when an external control signal 2 is input from a host control apparatus or the like to the monitor 35 and the stage driver 34, the device 16 is scanned by the stage driver 34, a degree of displacement of the probe 31A is obtained by scanning the device 16, and a piece of image information of the device 16 can be displayed on the monitor 35 according to the degree of displacement of the probe 31A. In this case, when a displacement detecting signal S1 indicating the degree of displacement of the probe 31A is output from the detecting element 31C to the feed back actuating element 31D, an output of the piezo element 31B is controlled by the feed back actuating element 31D according to the displacement detecting signal S1, for example, to hold a distance between the device 16 and the probe 31A constant.

As a result, the image information of the device 16 is displayed on the monitor 35 according to the tunnel current $I_t$, the displacement detecting signal S1 and the external control signal S2. Accordingly, a surface image of the device 16 and a voltage waveform of an actuating signal existing in the device 16 can be obtained at the same time according to the second embodiment. For example, in cases where an actuating signal of the device 16 in which an air-oxide film or the like having a thickness of about several tens angstroms remains on a wiring, the device 16 can be probed by placing the probe 31A with a cantilever having a low spring constant on an arbitrary measuring point of the device 16 while observing the surface image of the device 16 displayed on the monitor 35. Therefore, the sampling operation differs from that of the prior art, and there is no probability that the probe 31A is pushed into an insulating layer of the device 16 or a large force is applied on a top end of the probe 31A. Also, the tunnel current $I_t$ having a very low intensity can be sampled according to the reference voltage Vx using the I/V converter 331, the integrator 332, the sample holding circuit 333, the A/D converter 334, the comparator 335, the control logic circuit 336 and the A/D converter 337 in the same manner as in the first embodiment.

Accordingly, an actuating signal having no waveform distortion can be measured by observing the tunnel current $I_t$ flowing between a wiring of the device 16 and a top end of the probe 31A, in the same manner as in the first embodiment. Also, metallic surfaces of a wiring of the device 16 and a top end of the probe 31A can be maintained in a prescribed shape, and a life time of the probe 31A can be lengthened.

What is claimed is:

1. A signal measuring apparatus for adjusting a distance between a sample and a probe and measuring a signal using a tunnel current or an ohmic current flowing through the sample and the probe when a voltage is applied therebetween, comprising:

sampling means for sampling a current flowing through the sample and the probe according to a reference voltage to obtain a sample value;

means for comparing the sample value obtained in the sampling means and a current setting value arbitrarily set; and control means for receiving an output signal of the comparing means, generating the reference voltage according to the output signal, feeding back the reference voltage to the sampling means and controlling the current flowing through the sample and the probe using the reference voltage to converge the current at the current setting value, therein measuring the signal of the sample according to the reference voltage on condition that the current is converged at the current setting value.

2. The signal measuring apparatus according to claim 1 in which the sampling means comprises:

a first converting circuit for converting the current flowing through the sample and the probe into an output voltage according to the reference voltage generated by the control means;

an integrating circuit for integrating the output voltage converted in the first converting circuit to form an integrated output voltage;

a sample holding circuit for holding the integrated output voltage obtained in the integrating circuit; and a second converting circuit for converting the integrated output voltage held in the sample holding circuit into the sample value.

3. The signal measuring apparatus according to claim 1 in which the sampling means comprises a photoconductive element, which is excited and instantaneously set in a conductive condition by receiving a beam of light, for chopping the current, the current chopped being input into the sampling means.

4. The signal measuring apparatus according to claim 1 in which the control means comprises:

a logic circuit for receiving the output signal of the comparing means and generating a piece of control data according to the output signal to generate the reference voltage; and a converting circuit for converting the control data generated in the logic circuit into the reference voltage expressed in analog form.

5. The signal measuring apparatus according to claim 1 in which the reference voltage is generated in the control means to decrease the sample value obtained in the sampling means in cases where the sample value is higher than the current setting value, and the reference voltage is generated in the control means to increase the sample value in cases where the sample value is lower than the current setting value.

6. The signal measuring apparatus according to claim 1, further including distance adjusting means for adjusting a distance between the sample and the probe to sample the current flowing through the sample and the probe, of which the distance is adjusted, in the sampling means, the distance adjusting means comprising:
a piezo element for actuating the probe;
a detecting element for detecting a displacement of the probe actuated by the piezo element and outputting a displacement detecting signal indicating a degree of the displacement of the probe; and
a feed back actuating element for controlling the piezo element according to the displacement detecting signal output from the detecting element.

7. The signal measuring apparatus according to claim 1, further including:

distance adjusting means for adjusting a distance between the sample and the probe to sample the current flowing through the sample and the probe, of which the distance is adjusted;

scanning means for scanning one of a plurality of samples to obtain a degree of displacement of the probe; and displaying means for outputting a piece of image information of the sample according to the degree of displacement of the probe obtained in the scanning means.

8. The signal measuring apparatus according to claim 1, further comprising distance adjusting means for adjusting a distance between the sample and the probe to sample the current flowing through the sample and the probe, of which the distance is adjusted, in the sampling means, the distance adjusting means comprising the probe with a cantilever or a vertical needle.

9. A signal measuring method for measuring a signal of a sample using a probe, comprising the steps of:

setting a desired value of a current flowing through the sample and the probe to a current setting value in advance;

adjusting a distance between the sample and the probe to measure a signal of the sample;

applying a voltage through the sample and the probe to generate a current flowing through the sample and the probe;

sampling the current flowing through the sample and the probe to obtain a sample value of the sample;

comparing the sample value and the current setting value to generate a compared result;

generating a reference voltage according to the compared result;

converging a value of the current at the current setting value; and obtaining a signal of the sample from the reference voltage when the value of the current is converged at the current setting value.

10. The signal measuring method according to claim 9 in which the step of generating a reference voltage comprises the steps of:

generating the reference voltage to decrease the sample value in cases where the sample value is higher than the current setting value; and generating the reference voltage to increase the sample value in cases where the sample value is lower than the current setting value.

11. The signal measuring method according to claim 9 in which the step of applying a voltage comprises a step of generating a tunnel current flowing through the sample and the probe while adjusting a distance between the sample and the probe to sample the tunnel current.

12. The signal measuring method according to claim 9 in which the step of applying a voltage comprises the steps of:

pushing the probe onto the sample to set the probe in ohmic contact with the sample; and generating an ohmic current flowing through the sample and the probe according to the ohmic contact of the probe with the sample to sample the ohmic current.

13. The signal measuring method according to claim 9, further comprising the steps of:

generating a plurality of trigger signals for changeably using a measuring phase for the signal of the sample;

generating a laser beam according to one of the trigger signals; and performing an on-off control for the current flowing through the sample and the probe using the laser beam.

14. The signal measuring method according to claim 9, further comprising the steps of:

obtaining a first value of the reference voltage which minimizes a value of the current flowing through the sample and the probe by sweeping the reference voltage on condition that a supplying signal transferred to the sample is fixed, obtaining a second value of the reference voltage determined when the current is converged at the current setting value; and calculating a value of an offset voltage from the first and second values of the reference voltage.

15. The signal measuring method according to claim 9 in which the step of sampling the current comprises a step of changing the sample value of the current according to a supplying signal transferred to the sample, the step of generating a reference voltage comprises a step of obtaining the reference voltage from the sample value of the current changing, and the step of obtaining a signal comprises a step of subtracting an offset voltage from the reference voltage obtained.

* * * * *